United States Patent [19]

Shimizu

[11] Patent Number: 4,763,330
[45] Date of Patent: Aug. 9, 1988

[54] SYNDROME CALCULATING APPARATUS
[75] Inventor: Hiroshi Shimizu, Tama, Japan
[73] Assignee: Mita Industrial Co., Ltd., Japan
[21] Appl. No.: 44,916
[22] Filed: May 1, 1987
[51] Int. Cl.$^4$ .................. G06F 11/12; G06F 11/10
[52] U.S. Cl. .................................. 371/37; 371/38
[58] Field of Search ................ 371/37, 38, 39, 40

[56] References Cited

U.S. PATENT DOCUMENTS

| | | | |
|---|---|---|---|
| 4,608,692 | 8/1986 | Nagumo | 371/37 |
| 4,642,808 | 2/1987 | Baggen | 371/37 |
| 4,649,540 | 3/1987 | Proebsting | 371/37 |
| 4,649,541 | 3/1987 | Lahmeyer | 371/37 |
| 4,675,869 | 6/1987 | Driessen | 371/37 |
| 4,694,455 | 9/1987 | Koge | 371/37 |

Primary Examiner—Michael R. Fleming
Attorney, Agent, or Firm—Beveridge, DeGrandi & Weilacher

[57] ABSTRACT

Syndrome calculating apparatus in which a operation of the multiplication of each of the unit codes of a received code by power of the root $\alpha$ of the primitive polynomial in the Galois field is carried out first, a series of operations of the addition of the result by power of the root $\alpha$ to the next unit code and the multiplication of the result thus added by power of the root $\alpha$ are repeatedly carried out secondly so as to finally obtain syndromes, by a plurality of flip-flops disposed in parallel to one another, a pair of XOR gates disposed in parallel to each other for each of the flip-flops and a pair of AND gates for each of the flip-flops for selectively supplying the output data of the XOR gates to the flip-flops.

4 Claims, 9 Drawing Sheets

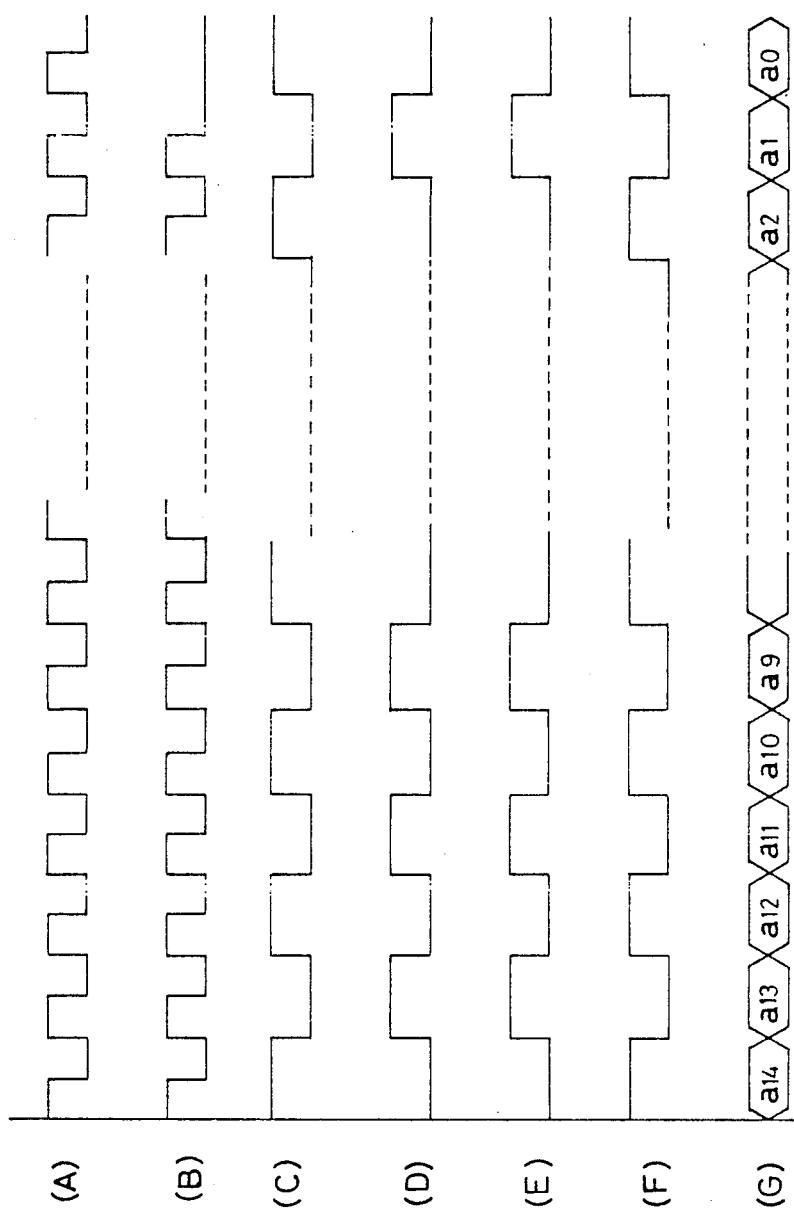

SYNDROME CALCULATING APPARATUS

BACKGROUND OF THE INVENTION

The present invention relates to syndrome calculating apparatus, and more particularly to syndrome calculating apparatus for obtaining syndromes from received codes where random errors and the like in received data are to be corrected with the Reed Solomon Code which is a kind of the BCH Code (Bose-Chaudhuri-Hocquenghem Code) used as an error correcting code.

In digital data transmission of high reliability, data are transmitted as coded in order to detect error patterns in received data and correct errors. In such case, it is most preferable to use, as an error correcting code, the Reed Solomon Code which has the highest correcting ability for random errors and which is a kind of the BCH Code.

In particular, optical disks recently developed present a higher error rate due to surface roughness of the optical disks themselves, turbulency of servo or the like, as compared with a magnetic disk device commonly used in the prior art. It is therefore indispensable to incorporate in an optical disk reproducing device a decoding device for detecting and correcting errors in data read from the optical disks.

Such decoding includes the following steps of:
(1) obtaining syndromes from a received data;
(2) obtaining the number of error locations from the syndromes;
(3) obtaining the dimension of an error; and
(4) executing error correction.

The Reed Solomon Code is constituted by the elements in the Galois field GF ($q^m$). For a digital circuit, $q=2$ can be established. When the primitive element of this Galois field GF ($2^m$) is $\alpha$, the following equation is established:

$$\alpha^{2^m-1}=1$$

When m bits constitute 1 symbol, the generator polynomial for error correction of t symbols can be expressed by the following equation:

$$g(x)=(x-\alpha)(x-\alpha^2)\ldots(x-\alpha^{2t}), \text{ or}$$

$$g(x)=(x-1)(x-\alpha)\ldots(x-\alpha^{2t-1})$$

The code polynomial of a transmission code of a data symbol added by an inspection symbol is expressed by the following equation:

$$\begin{aligned} f(x) &= Q(x)g(x) \\ &= b_0 + b_1 x + b_2 x^2 + \ldots + b_{n-1}x^{n-1} \end{aligned}$$

Accordingly, when f (x) is equal to 0, then 1, $\alpha$, $\alpha^2$, ..., $\alpha^{2t-1}$, or $\alpha$, $\alpha^2$, ..., $\alpha^{2t}$ are the root.

That is, the following equations are established:

$$f(1) = b_0 + b_1 + \ldots + b_{n-1} = 0,$$

$$\begin{aligned} f(\alpha) &= b_0 + b_1\alpha + b_2\alpha^2 + \ldots + b_{n-1}\alpha^{n-1} \\ &= 0, \ldots, \end{aligned}$$

$$f(\alpha^{2t-1}) = b_0 + b_1\alpha^{2t-1} + b_2(\alpha^{2t-1})^2 + \ldots +$$

$$b_{n-1}(\alpha^{2t-1})^{n-1} = 0.$$

or $$\begin{aligned} f(\alpha) &= b_0 + b_1\alpha + b_2\alpha^2 + \ldots + b_{n-1}\alpha^{n-1} \\ &= 0, \ldots, \end{aligned}$$

$$f(\alpha^2) = b_0 + b_1\alpha^2 + b_2(\alpha^2)^2 + \ldots +$$

$$b_{n-1}(\alpha^2)^{n-1} = 0, \ldots,$$

$$f(\alpha^{2t}) = b_0 + b_1\alpha^{2t} + b_2(\alpha^{2t})^2 + \ldots +$$

$$b_{n-1}(\alpha^{2t})^{n-1} = 0$$

In fact, when the transmission code above-mentioned ($b_0, b_1, \ldots, b_{n-1}$) is transmitted and received, it is not ensured at all that the received code ($a_0, a_1, \ldots, a_{n-1}$) is the same as the transmission code and it is therefore not ensured that 0 is obtained for all equations above-mentioned.

Therefore, the following equations are established:

$$f(1) = a_0 + a_1 + \ldots + a_{n-1} = S_0,$$

$$\begin{aligned} f(\alpha) &= a_0 + a_1\alpha + a_2\alpha^2 + \ldots + a_{n-1}\alpha^{n-1} \\ &= S_1, \ldots, \end{aligned}$$

$$f(\alpha^{2t-1}) = a_0 + a_1\alpha^{2t-1} + a_2(\alpha^{2t-1})^2 + \ldots +$$

$$a_{n-1}(\alpha^{2t-1})^{n-1} = S_{2t-1},$$

or $$f(\alpha) = a_0 + a_1\alpha + a_2\alpha^2 + \ldots + a_{n-1}\alpha^{n-1} = S_0,$$

$$\begin{aligned} f(\alpha^2) &= a_0 + a_1\alpha^2 + a_2(\alpha^2)^2 + \ldots + a_{n-1}(\alpha^2)^{n-1} \\ &= S_1, \ldots, \end{aligned}$$

$$f(\alpha^{2t}) = a_0 + a_1\alpha^{2t} + a_2(\alpha^{2t})^2 + \ldots +$$

$$a_{n-1}(\alpha^{2t})^{n-1} = S_{2t-1}$$

$S_i$ ($i=0, 1, \ldots 2t$) becomes 0 when the transmission code has been received without errors, but it becomes other value than 0 if the transmission code has been erroneously received. Such $S_i$ is defined as a syndrome.

Therefore, from syndromes $S_0, S_1, \ldots, S_{2t-1}$ obtained according to the equations above-mentioned, an error location polynomial is obtained. Then, the inverse elements of the roots of the error location polynomial can be obtained so that the error locations are obtained and the error are corrected.

In a series of the calculations above-mentioned, the calculations for obtaining the respective syndromes $S_0$, $S_1, \ldots, S_{2t-1}$ are surprisingly troublesome. In order to carry out these calculations at a high speed, there has been conventionally proposed syndrome calculating apparatus constituted by, for example, ROM tables and shift registers (Unexamined Patent Publication No. 5759/1984).

This syndrome calculating apparatus above-mentioned is designed to calculate the following equations faithfully:

$$f(1) = a_0 + a_1 + \ldots + a_{n-1} = S_0,$$

$$f(\alpha) = a_0 + a_1\alpha + a_2\alpha^2 + \ldots + a_{n-1}\alpha^{n-1}$$
$$= S_1, \ldots,$$

$$f(\alpha^{2t-1}) = a_0 + a_1\alpha^{2t-1} + a_2(\alpha^{2t-1})^2 + \ldots +$$
$$a_{n-1}(\alpha^{2t-1})^{n-1} = S_{2t-1},$$

or $$f(\alpha) = a_0 + a_1\alpha + a_2\alpha^2 + \ldots + a_{n-1}\alpha^{n-1}$$
$$= S_0, \ldots,$$

$$f(\alpha^2) = a_0 + a_1\alpha^2 + a_2(\alpha^2)^2 + \ldots + a_{n-1}(\alpha^2)^{n-1}$$
$$= S_1, \ldots,$$

$$f(\alpha^{2t}) = a_0 + a_1\alpha^{2t} + a_2(\alpha^{2t})^2 + \ldots +$$
$$a_{n-1}(\alpha^{2t})^{n-1} = S_{2t-1}$$

It is therefore required to use ROMs having an excessively great capacity, and the syndrome calculating time cannot be sufficiently shortened, as a whole.

SUMMARY OF THE INVENTION

It is an object of the present invention to provide syndrome calculating apparatus capable of calculating syndromes at a high speed.

It is another object of the invention to provide syndrome calculating apparatus having a simplified structure.

In order to achieve the objects above-mentioned, the syndrome calculating apparatus in accordance with the invention comprises:

first addition means for respectively supplying the bits of each of unit codes constituting a received code to a plurality of latch means;

second addition means for supplying, to at least one of the plurality of latch means, the output bit of at least one of the plurality of latch means;

gate means for supplying the signals of the first and second addition means to the plurality of latch means, respectively; and gate control means for selectively opening the gate means;

the output bits of the plurality of latch means being supplied respectively to the first addition means connected to the vary latch means;

the output bit of said at least one of the plurality of latch means being supplied to the second addition means connected to said at least one of the plurality of latch means so as to produce the same result as that obtained by the multiplication of power of the root of the primitive polynomial in the Galois field.

In obtaining syndromes by successively entering received codes to the syndrome calculating apparatus arranged as above-mentioned, one gate means is opened by a control signal from the gate control means so that only the respective bits of each of unit codes constituting a received code, or the unit codes constituting a received code and the output bits of the plurality of latch means as respectively added to each other by the first addition means, are supplied again to the plurality of latch means. Then, the other gate means is opened by a control signal from the gate control means so that the output bits of the plurality of latch means as added to one another by the second addition means are supplied to at least one of the plurality of latch means so as to produce the same result obtained by the operation of multiplication power of the root of the primitive polynomial in the Galois field. Thereafter, one gate means and the other gate means are alternately opened so that the addition and latch operations above-mentioned are repeated. Then, there can be finally obtained the bits constituting the syndromes, from the respective latch means.

The foregoing will be discussed in more detail in the following.

When the following polynomial is considered:

$$T_i(\alpha^j) = (\ldots ((a_i\alpha^j + a_{i-1})\alpha^j + a_{i-2})\alpha^j + \ldots)\alpha^j + a_0,$$

the multiplication by $(2^m - 1)$ power of the root $\alpha$ in the primitive polynomial in the Galois field GF $(2^m)$, results in 1 and the following equation is established:

$$T_i(\alpha^j) = a_i\alpha^{ij} + a_{i-1}\alpha^{(i-1)j} + \ldots + a_1\alpha^j + a_0$$
$$= (\ldots ((a_i\alpha^j + a_{i-1})\alpha^j + a_{i-2})\alpha^j +$$
$$\ldots a_1\alpha^j) + a_0 = S_i$$

Therefore, by repeating a series of operations of the multiplication of the unit codes of a received code by $\alpha^j$, the addition of the results thus multiplied, to the next unit codes and the multiplication by $\alpha^j$ of the results thus added, the syndrome $S^i$ can be finally obtained.

It is preferable that the syndrome calculating apparatus in accordance with the present invention comprises:

a pair of calculating units to which unit codes in the odd place and unit codes in the even place are respectively entered successively;

third addition means for adding the output bits of one of the pair of calculating units to which unit codes in the even place are successively entered, to one another so that such addition corresponds to the operation of multiplication of power of the root; and fourth addition means for adding the output bits of the other of the pair of calculating units to which unit codes in the odd place are successively entered, to the output bits of the third addition means in a correlative manner; and each calculating unit further comprises:

first addition means for respectively supplying the bits of each of unit codes constituting a received code to a plurality of latch means;

second addition means for supplying, to at least one of the plurality of latch means, the output bit of at least one of the plurality of latch means;

gate means for supplying the signals of the first and second addition means to the plurality of latch means, respectively;

gate control means for selectively opening the gate means;

the output bits of the plurality of latch means being supplied respectively to the first addition means connected to the vary latch means;

the output bit of said at least one of the plurality of latch means being supplied to the second addition means connected to said at least one of said plurality of latch means so as to produce the same result as that obtained by the operation of multiplication of power of the root of the primitive polynomial in the Galois field.

In obtaining syndromes by successively entering received codes to the syndrome calculating apparatus arranged as above-mentioned, unit codes in the odd place and unit codes in the even place are respectively supplied to the pair of calculating units successively. In each of the calculating units, one gate means is opened by a control signal from the gate control means so that only the respective bits of each of unit codes constituting a received code, or the unit codes constituting a received code and the output bits of the plurality of latch means as respectively added to each other by the first addition means are supplied again to the plurality of latch means. Then, the other gate means is opened by a control signal from the gate control means so that the output bits of the respective latch means as added to one another by the second addition means are supplied to at least one of the plurality of latch means so as to produce the same result obtained by the operation of the multiplication of power of the root of the primitive polynomial in the Galois field. Thereafter, one gate means and the other gate means are alternately opened so that the addition and latch operations above-mentioned are repeated to carry out necessary calculations. Thereafter, the output bits of one of the calculating units to which unit codes in the even place are successively entered, are added to one another by the third addition means to obtain the output bits equal to values obtained by the multiplication of power of the root. Then, the output bits of the other of the calculating units to which unit codes in the odd place are successively entered, are added to the output bits of the third addition means by the fourth addition means in a correlative manner. There can be finally obtained the bits constituting syndromes.

The foregoing will be discussed in more detail in the following.

When the following polynomial is considered:

$$T_i(\alpha^j) = (\ldots((d_i\alpha^j + d_{i-1})\alpha^j + d_{i-2})\alpha^j + \ldots)\alpha^j + d_0,$$

it is easily made sure that this polynomial is the same as the following formula:

$$d_i\alpha^{ij} + d_{i-1}\alpha^{(i-1)j} + d_{i-2}\alpha^{(i-2)j} + \ldots + d_1\alpha^j + d_0$$

Since this formula has the same form as that of the syndrome calculating formula, the syndrome can be expressed in the form of $T_i(\alpha^j)$.

The syndrome $S_i$ ($i=0, 1, \ldots, 2t$ or $2t-1$, where t is the error correcting ability) in the Reed Solomon Code having a code length $n=2^m-1$ can be obtained by the following equation:

$$S_i = b_{n-1}(\alpha^i)^{n-1} + b_{n-2}(\alpha^i)^{n-2} + b_{n-3}(\alpha^i)^{n-3} + \ldots + b_2(\alpha^i)^2 + b_1\alpha^i + b_0$$

where $(b_{n-1}, b_{n-2}, \ldots, b_1, b_0)$ are transmission signals.

The syndromes $S_i$ above-mentioned can be changed into the following equation so that $S_i$ can be expressed in the form of $T_i(\alpha^j)$.

$$\begin{aligned}
S_i &= \{b_{n-1}(\alpha^i)^{n-1} + b_{n-3}(\alpha^i)^{n-3} + \ldots + b_2(\alpha^i)^2 + b_0\} + \{b_{n-2}(\alpha^i)^{n-2} + b_{n-4}(\alpha^i)^{n-4} + \ldots + b_1\alpha^i\} \\
&= \{b_{n-1}(\alpha^i)^{n-1} + b_{n-3}(\alpha^i)^{n-3} + \ldots + b_2(\alpha^i)^2 + b_0\} + \alpha^i\{b_{n-2}(\alpha^i)^{n-3} + b_{n-4}(\alpha^i)^{n-5} + \ldots + b_1\} \\
&= T_p(\alpha^{2i}) + \alpha^i T_{p-1}(\alpha^{2i})
\end{aligned}$$

where $p=2^{m-1}-1$

Accordingly, a series of operations of respectively fetching the unit codes of received codes in the odd place and even place successively, multiplying these codes by $\alpha^j$, adding the results thus multiplied to the next unit codes and multiplying the results thus added by $\alpha^j$, are repeated. Then, the output bits of the calculating unit for the odd place are added to one another so that such addition corresponds to the operation of multiplication of power of the root. Then, the bits obtained) by this addition are added to the output bits of the calculating unit for the even place in a correlative manner (so that such addition produces the same result obtained by the calculation of $$S_i = T_p(\alpha^{2i}) + \alpha^i T_{p-1}(\alpha^{2i})$$

where $p=2^{m-1}-1$.

Then, the syndrome $S_i$ can be finally obtained.

Further, when the Galois field above-mentioned is GF ($2^m$), there can be obtained syndromes for decoding binary received codes used in transmission of digital data, reading of digital data from optical disks, etc. and so forth.

BRIEF DESCRIPTION OF THE DRAWINGS

FIG. 7 is a timing chart illustrating a syndrome calculating operation in the embodiment in FIG. 6.

DETAILED DESCRIPTION OF THE PREFERRED EMBODIMENTS

Figure 9:
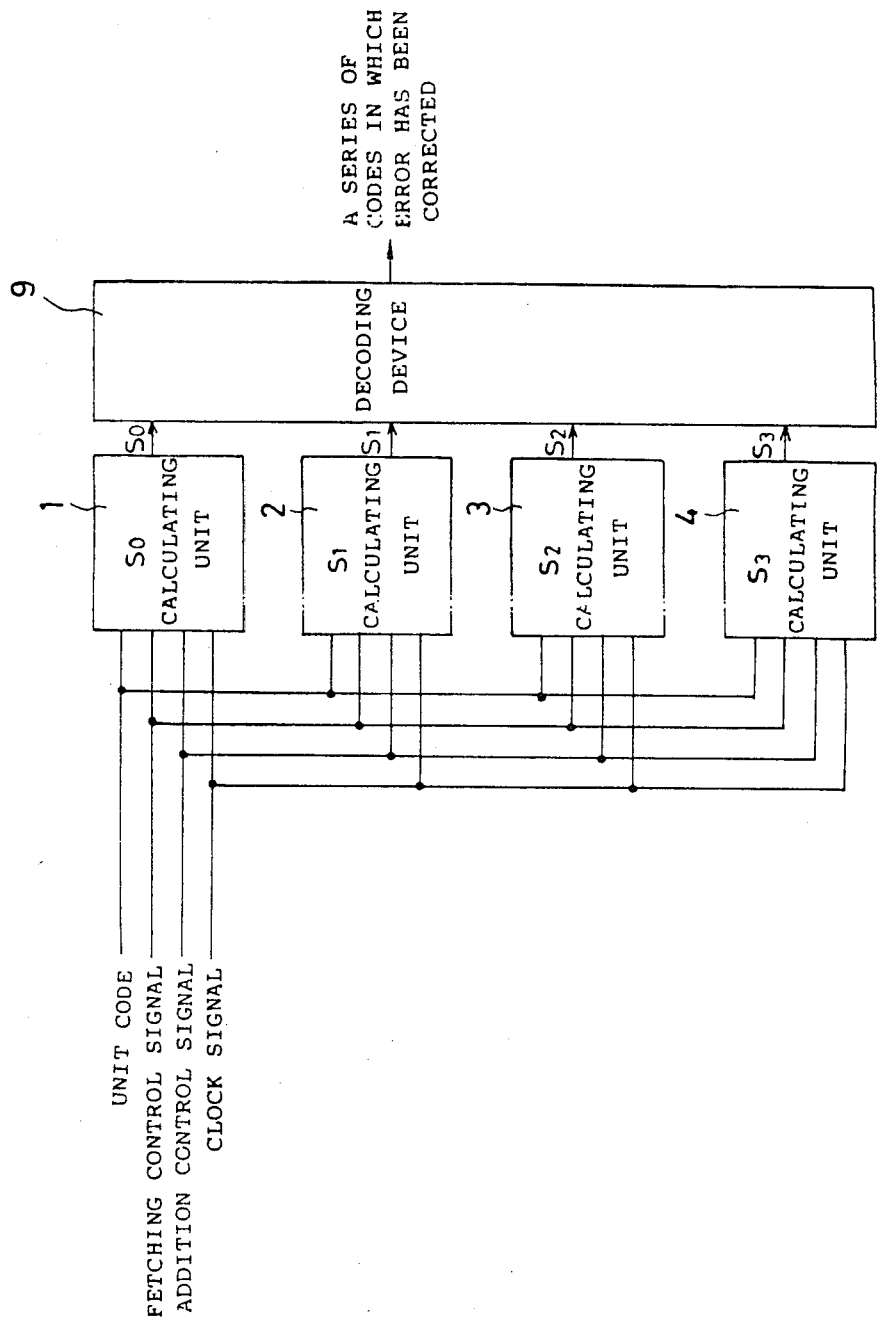
FIG. 9 is a block diagram schematically showing processing for decoding with the use of syndrome calculating apparatus in accordance with the present invention.

FIG. 9 is a block diagram schematically showing processing for decoding received codes with a double error correcting RS code in GF ($2^4$) with the use of syndrome calculating apparatus in accordance with the present invention.

To syndrome calculating units 1, 2, 3 and 4 for respectively calculating syndromes $S_0$, $S_1$, $S_2$ and $S_3$, the unit codes of a received code, a unit code fetching controlling signal, a signal for controlling addition corresponding to multiplication and a clock signal are supplied in succession to obtain the syndromes $S_0$, $S_1$, $S_2$ and $S_3$. These syndromes $S_0$, $S_1$, $S_2$ and $S_3$ are entered into a decoding device 9 so that a series of codes in which errors have been corrected can be obtained.

The primitive polynomial in the Galois field GF ($2^4$) is given by $x^4+x+1$. Where the root of this primitive polynomial is $\alpha$, the following equation is established:

$$\alpha^4+\alpha+1=0$$

Since the Galois field GF ($2^4$) is an extension field of the ground field GF (2), the operation conditions in the GF (2) are satisfied in the operations in the Galois field GF ($2^4$), so that the following equations are established:

$$1+1=0, \ 1+0=0+1=1, \ 0+0=0$$

Accordingly, the equation above-mentioned $\alpha^4+\alpha+1=0$ is the same as $\alpha^4=\alpha+1$.

This embodiment employs the following generator polynomial g (x):

$$g(x)=(x-1)(x-\alpha)(x-\alpha^2)(x-\alpha^3)$$

The syndrome calculating unit 1 is so designed as to calculate $S_0=a_0+a_1+\ldots+a_{14}$. It is therefore sufficient to add in succession the unit codes of a received code entered, to one another as they are. The syndrome $S_0$ can be easily obtained by using, for example, an arrangement which has JK flip-flops (not shown) each corresponding to each of the bits of a unit code and which is designed to supply, to a JK input terminal of the JK flip-flops, the respective bits of a unit code and the output of corresponding JK flip-flops are supplied through XOR gates (not shown).

Figure 1:
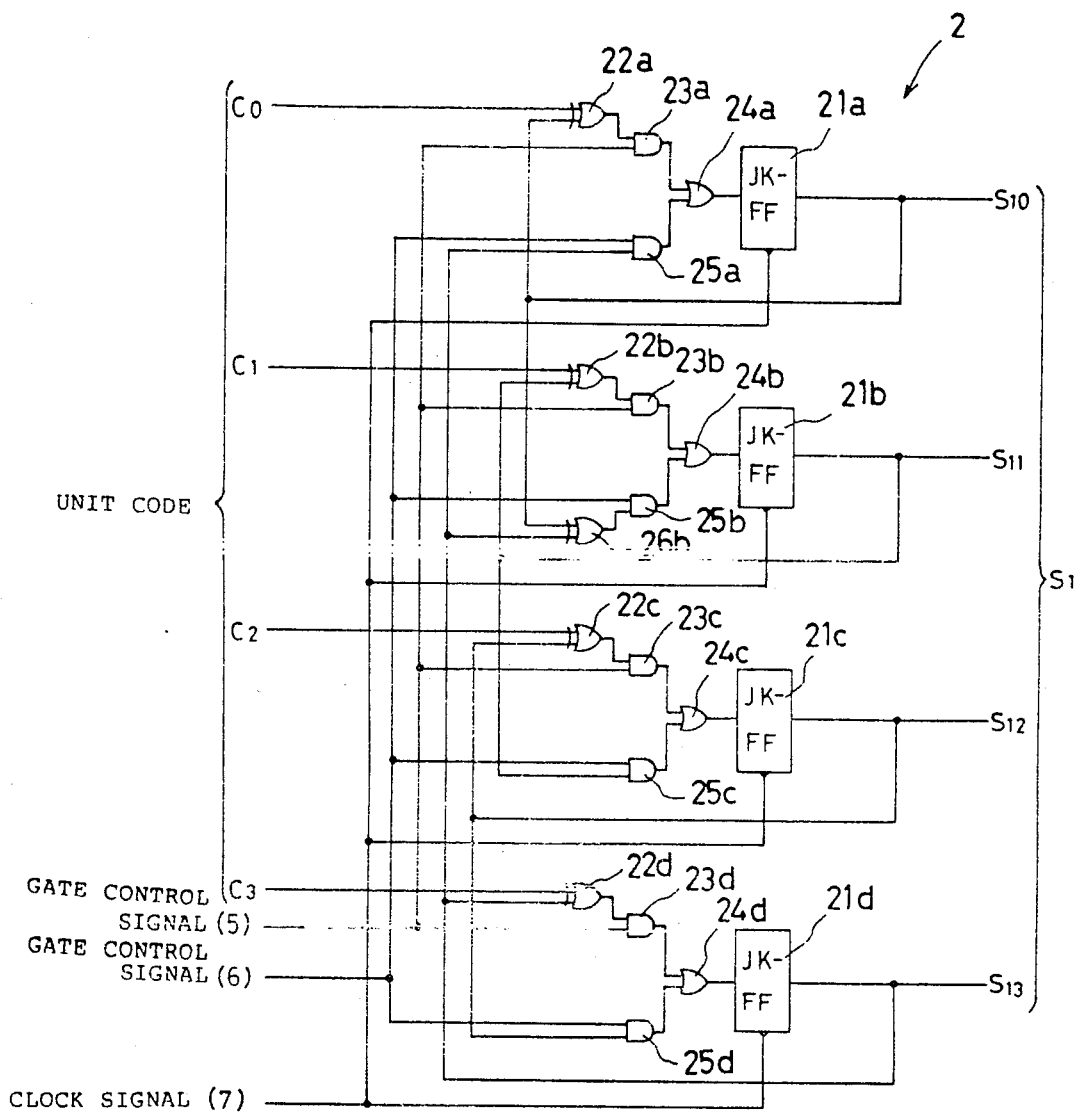
FIG. 1 is an electric circuit diagram showing an embodiment of a syndrome calculating unit for calculating a syndrome $S_1$.

FIG. 1 is an electric circuit diagram showing an embodiment of the syndrome calculating unit 2 for calculating the syndrome $S_1$.

The syndrome calculating unit 2 has four JK flip-flops 21a, 21b, 21c and 21d respectively corresponding to the bits of each of unit codes of a received code, and includes XOR gates 22a, 22b, 22c and 22d to which the respective bits of a unit code and the output signals of the JK flip-flops 21a, 21b, 21c and 21d are supplied, AND gates 23a, 23b, 23c and 23d adapted to be opened by a gate control signal 5 for supplying the output signals from the XOR gates 22a, 22b, 22c and 22d to OR gates 24a, 24b, 24c and 24d, respectively, and AND gates 25a, 25b, 25c and 25d adapted to be opened by a gate control signal 6 for supplying the output signals of the JK flip-flops to the OR gates 24a, 24b, 24c and 24d, respectively. An XOR gate 26b is disposed at the input side of the AND gate 25b. The output signals of the JK flip-flops 21a and 21d are supplied to the input terminal of the XOR gate 26b. The output signal of the JK flip-flop 21b is supplied to the input terminal of the AND gate 25c. The output signal of the JK flip-flop 21d is supplied to the input terminal of the AND gate 25a. The output signal of the JK flip-flop 21c is supplied to the input terminal of the AND gate 25d. Further, a clock signal 7 and a clear signal (not shown) are respectively supplied to a clock input terminal and a clear input terminal of each of the JK flip-flops 21a, 21b, 21c and 21d.

The following description will discuss the operation of the syndrome calculating unit 2 arranged as above-mentioned.

For example, an arbitrary element in the Galois field GF ($2^4$) is expressed by the following equation:

$$a_i=c_0+c_1\alpha+c_2\alpha^2+c_3\alpha^3.$$

Therefore, the following equations are established:

$$\begin{aligned} a_i\alpha &= (c_0 + c_1\alpha + c_2\alpha^2 + c_3\alpha^3)\alpha \\ &= c_3 + (c_0 + c_3)\alpha + c_1\alpha^2 + c_2\alpha^3. \end{aligned}$$

Accordingly, when the bits $c_0$, $c_1$, $c_2$ and $c_3$ are respectively supplied to the XOR gates 22a, 22b, 22c and 22d and the AND gates 23a, 23b, 23c and 23d are opened by the gate control signal 5, the JK flip-flops 21a, 21b, 21c and 21d supply the bits $c_0$, $c_1$, $c_2$ and $c_3$ as they are. Therefore, when the AND gates 25a, 25b, 25c and 25d are opened by the gate control signal 6, the bit $c_3$ is supplied to the JK flip-flop 21a, the bit $c_0$ and the bit $c_3$ as added to each other by the XOR gate 26b are supplied to the JK flip-flop 21b, the bit $c_1$ is supplied to the JK flip-flop 21c and the bit $c_2$ is supplied to the JK flip-flop 21d. That is, with no multiplication specially carried out, a series of bits corresponding to $c_3+(c_0+c_3)\alpha+c_1\alpha^2+c_2\alpha^3$ are supplied from the JK flip-flops 21a, 21b, 21c and 21d.

Figure 2:
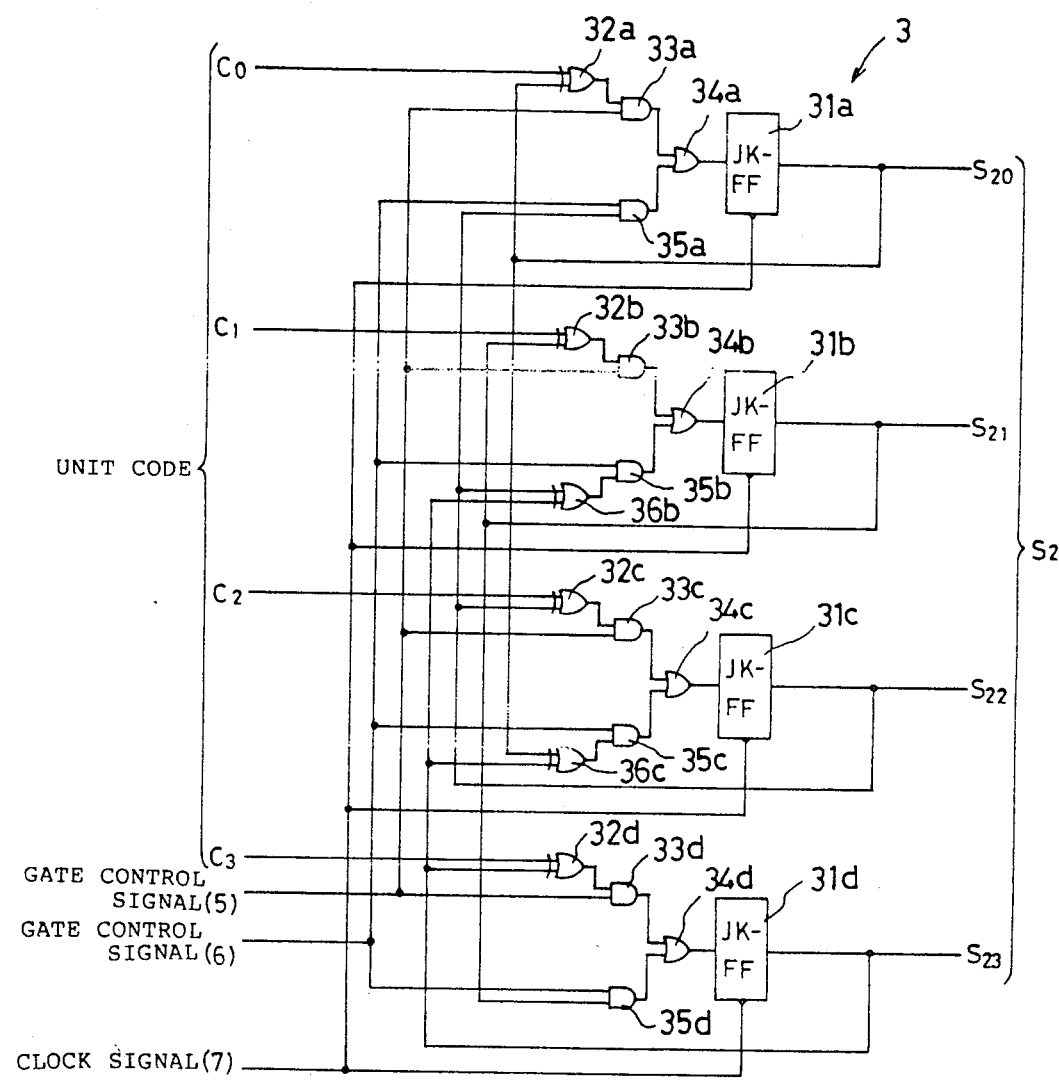
FIG. 2 is an electric circuit diagram showing an embodiment of a syndrome calculating unit for calculating a syndrome $S_2$.

FIG. 2 is an electric circuit diagram showing an embodiment of the syndrome calculating unit 3 for calculating the syndrome $S_2$.

The syndrome calculating unit 3 has four JK flip-flops 31a, 31b, 31c and 31d corresponding to the respective bits of each of unit codes of a received code, and includes XOR gates 32a, 32b, 32c and 32d to which the respective bits of a unit code and the output signals of the JK flip-flops 31a, 31b, 31c and 31d are supplied, AND gates 33a, 33b, 33c and 33d adapted to be opened by the gate control signal 5 for supplying the output signals of the XOR gates 32a, 32b, 32c and 32d to OR gates 34a, 34b, 34c and 34d, respectively, and AND gates 35a, 35b, 35c and 35d adapted to be opened by the gate control signal 6 for supplying the output signals of the JK flip-flop to the OR gates 34a, 34b, 34c and 34d. XOR gates 36b and 36c are disposed at the input side of the AND gates 35b and 35c. The output signals of the JK flip-flops 31c and 31d are supplied to the input terminal of the XOR gate 36b. The output signals of the JK flip-flops 31a and 31d are supplied to the input terminal of the XOR gate 36c. The output signal of the JK flip-flop 31c is supplied to the input terminal of the AND gate 35a. The output signal of the JK flip-flop 31b is supplied to the input terminal of the AND gate 35d. Further, a clock signal 7 and a clear signal (not shown) are respectively supplied to a clock input terminal and a clear input terminal of each of the JK flip-flops 31a, 31b, 31c and 31d.

The following description will discuss the operation of the syndrome calculating unit 3 arranged as above-mentioned.

The following equation is established:

$$a_i\alpha^2 = (c_0 + c_1\alpha + c_2\alpha^2 + c_3\alpha^3)\alpha^2$$
$$= c_2 + (c_2 + c_3) + (c_0 + c_3)\alpha^2 + c_1\alpha^3.$$

Accordingly, when the bits $c_0$, $c_1$, $c_2$ and $c_3$ are respectively supplied to the XOR gates 32a, 32b, 32c and 32d and the AND gates 33a, 33b, 33c and 33d are opened by the gate control signal 5, the JK flip-flops 31a, 31b, 31c and 31d supply the bits above-mentioned $c_0$, $c_1$, $c_2$, $c_3$ as they are. Therefore, when the AND gates 35a, 35b, 35c and 35d are opened by the gate control signal 6, the bit $c_2$ is supplied to the JK flip-flop 31a, the bits $c_2$ and $c_3$ as added to each other by the XOR gate 36b are supplied to the JK flip-flop 31b, the bits $c_0$ and $c_3$ as added to each other by the XOR gate 36c are supplied to the JK flip-flop 31c, and the bit $c_1$ is supplied to the JK flip-flop 31d. That is, with no multiplication specially carried out, the JK flip-flops 31a, 31b, 31c and 31d supply a series of bits corresponding to $c_2+(c_2+c_3)\alpha+(c_0+c_3)\alpha^2+c_1\alpha^3$.

Figure 3:
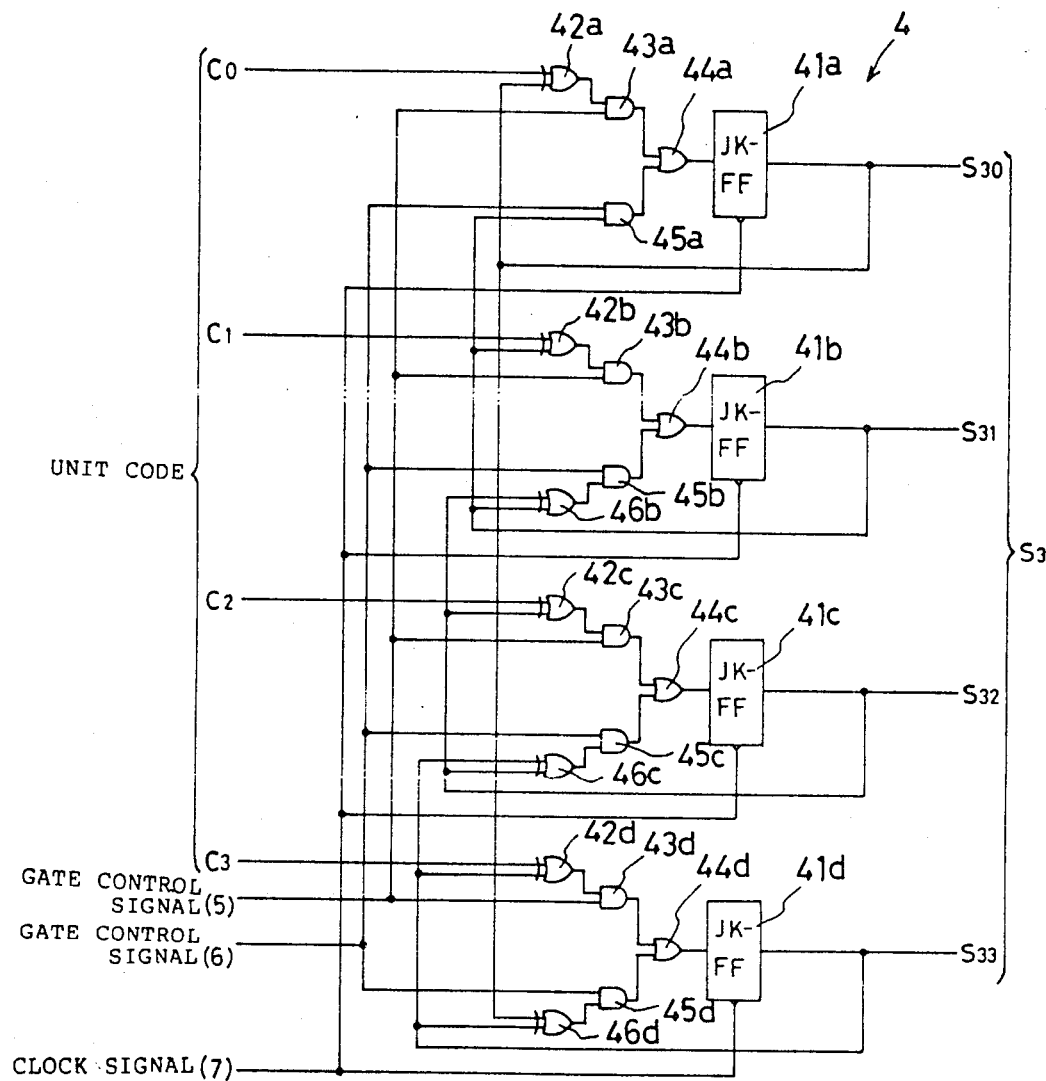
FIG. 3 is an electric circuit diagram showing an embodiment of a syndrome calculating unit for calculating a syndrome $S_3$.

FIG. 3 is an electric circuit diagram showing an embodiment of the syndrome calculating unit 4 for calculating the syndrome $S_3$.

This syndrome calculating unit 4 has four JK flip-flops 41a, 41b, 41c and 41d corresponding to the respective bits of each of units codes of a received code, and includes XOR gates 42a, 42b, 42c and 42d to which the respective bits of a unit code and the output signals of the JK flip-flops 41a, 41b, 41c and 41d are supplied, AND gates 43a, 43b, 43c and 43d adapted to be opened by a gate control signal 5 for supplying the output signals of the XOR gates 42a, 42b, 42c and 42d to OR gates 44a, 44b, 44c and 44d, respectively, and AND gates 45a, 45b, 45c and 45d adapted to be opened by a gate control signal 6 for supplying the output signals of the JK flip-flops to the OR gates 44a, 44b, 44c and 44d, respectively. XOR gates 46b, 46c and 46d are disposed at the input side of the AND gates 45b, 45c and 45d. The output signals of the JK flip-flops 41b and 41c are supplied to the input terminals of the XOR gate 46b. The output signals of the JK flip-flops 41c and 41d are supplied to the input terminals of the XOR gate 46c. The output signals of the JK flip-flops 41a and 41d are supplied to the input terminals of the XOR gate 46d. The output signals of the JK flip-flops 41b is supplied to an input terminal of the AND gate 45a. Further, a clock signal 7 and a clear signal (not shown) are respectively supplied to a clock input terminal and a clear input terminal of each of the JK flip-flops 41a, 41b, 41c and 41d.

The following description will discuss the operation of the syndrome calculating unit 4 arranged as above-mentioned.

The following equation is established:

$$a_i\alpha^3 = (c_0 + c_1\alpha + c_2\alpha^2 + c_3\alpha^3)\alpha^3$$
$$= c_1 + (c_1 + c_2)\alpha + (c_2 + c_3)\alpha^2 + (c_0 + c_3)\alpha^3.$$

Accordingly, when the bits $c_0$, $c_1$, $c_2$ and $c_3$ are respectively supplied to the XOR gates 42a, 42b, 42c and 42d and the AND gates 43a, 43b, 43c and 43d are opened by a gate control signal 5, the JK flip-flops 41a, 41b, 41c and 41d supply the bits above-mentioned $c_0$, $c_1$, $c_2$ and $c_3$ as they are. Therefore, when the AND gates 45a, 45b, 45c and 45d are opened by a gate control signal 6, the bit $c_1$ is supplied to the JK flip-flop 41a, the bits $c_1$ and $c_2$ as added to each other by the XOR gate 46b are supplied to the JK flip-flop 41b, the bits $c_2$ and $c_3$ as added to each other by the XOR gate 46c are supplied to the JK flip-flop 41c, and the bits $c_0$ and $c_3$ as added to each other by the XOR the 46d are supplied to the JK flip-flop 41d. That is, with no multiplication specially carried out, the JK flip-flops 41a, 41b, 41c and 41d supply a series of bits corresponding to $c_1+(c_1+c_2)\alpha+(c_2+c_3)\alpha^2+(c_0+c_3)\alpha^3$.

In each of the syndrome calculating units above-mentioned, after the necessary additions have been made, the clear signal (not shown) is supplied to the JK flip-flops to clear the contents of the JK flip-flops to zero, thus preparing for the next syndrome calculation.

Figure 4:
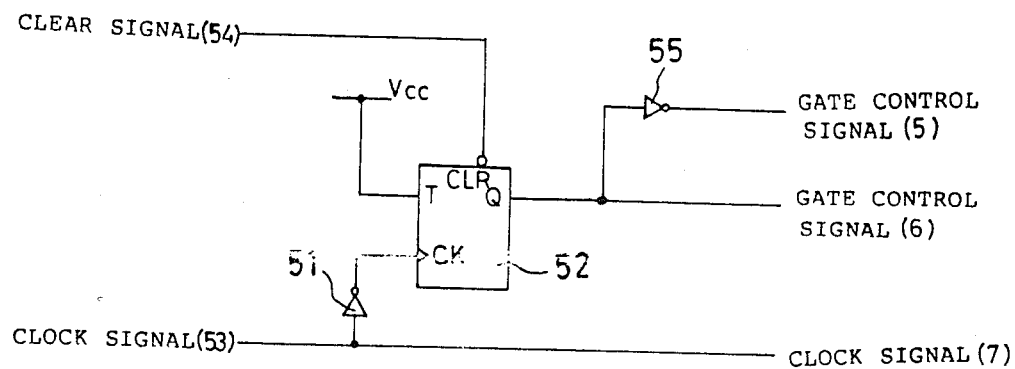
FIG. 4 is an electric circuit diagram showing an embodiment of a unit for generating a control signal.

FIG. 4 shows an embodiment of a circuit for generating the gate control signals 5 and 6, and the clock signal 7.

In this embodiment, a clock signal 53 externally supplied, is used, as it is, as the clock signal 7. This clock signal 53 as inverted by an inverter 51 is supplied to a clock input terminal of a T flip-flop 52. A positive power voltage is applied to a T input terminal and a clear signal 54 is supplied to a clear terminal. The output signal Q, as it is, of the T flip-flop 52 is used as the gate control signal 6. This output signal Q taken out through an inverter 55 is used as the gate control signal 5.

Figure 5:
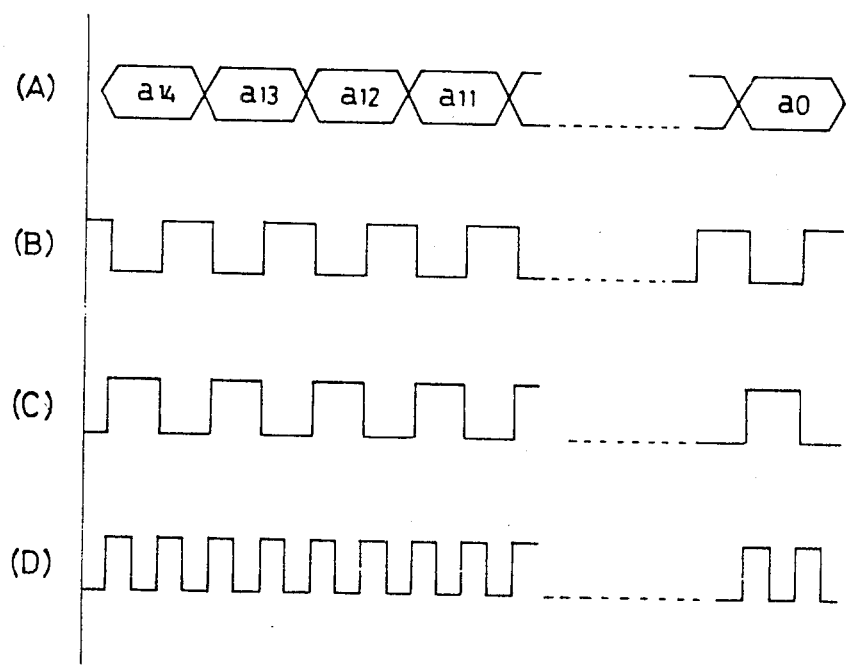
FIGS. 5(A)–(D) is a timing chart illustrating a syndrome calculating operation.

FIG. 5 is a timing chart illustrating the syndrome calculating operation above-mentioned.

The clock signal 7 is a pulse signal having a predetermined period as shown by D in FIG. 5. At the falling timing of this pulse signal, the JK flip-flops fetch data.

As respectively shown by C and B in FIG. 5, the gate control signals 5 and 6 have a period twice the period of the clock signal 7 and are opposite in phase for alternately opening the AND gates.

Accordingly, while the gate control signal 5 is in the high level the first time, the AND gates are opened to supply the first unit code $a_{14}$ (See A in FIG. 5) of a received code to the JK input terminals of the JK flip-flops and this unit code $a_{14}$ is fetched by the JK flip-flops at the falling timing of the clock signal 7.

Then, while the gate control signal 6 is in the high level, the AND gates are opened to supply the output signals of the JK flip-flops to the JK input terminals of the JK flip-flops so as to produce the same result obtained by the operation of multiplication of power of $\alpha$, and the output signals above-mentioned are fetched by the JK flip-flops at the falling timing of the clock signal 7.

While the gate control signal 5 becomes the high level the second time, the AND gates are opened to supply the second unit code $a_{13}$ of the received code (See A in FIG. 5) and the output signals of the JK flip-flops as added by the XOR gates, to the JK input terminals of the JK flip-flops, and at the falling timing of the clock signal 7 the signals thus added are fetched by the JK flip-flops.

Then, while the gate control signal 6 is in the high level, the AND gates are opened to supply the output signals of the JK flip-flops to the JK input terminals of the JK flip-flops so as to produce the same result obtained by the operation of multiplication of power of α, and at the falling timing of the clock signal 7 the output signals above-mentioned are fetched by the JK flip-flops.

Thereafter, a series of operations above-mentioned to be made after the gate control signal 5 has become the high level the second time, are repeated many times as required so that a syndrome can be obtained.

That is, $$T_{14}(\alpha) = (\ldots ((a_{14}\alpha + a_{13})\alpha + a_{12})\alpha + \ldots )\alpha + a_0,$$

$$T_{14}(\alpha^2) = (\ldots ((a_{14}\alpha^2 + a_{13})\alpha^2 + a_{12})\alpha^2 + \ldots )\alpha^2 + a_0,$$

and $$T_{14}(\alpha^3) = (\ldots ((a_{14}\alpha^3 + a_{13})\alpha^3 + a_{12})\alpha^3 + \ldots )\alpha^3 + a_0,$$

the operations of the multiplication of power of α (to be carried out for the first operation only) and the multiplication of the multiplied result added to the next unit code, by power of α, are repeated for each period of the gate control signal as the number of iterations as required, so that a syndrome can be obtained.

Figure 8:
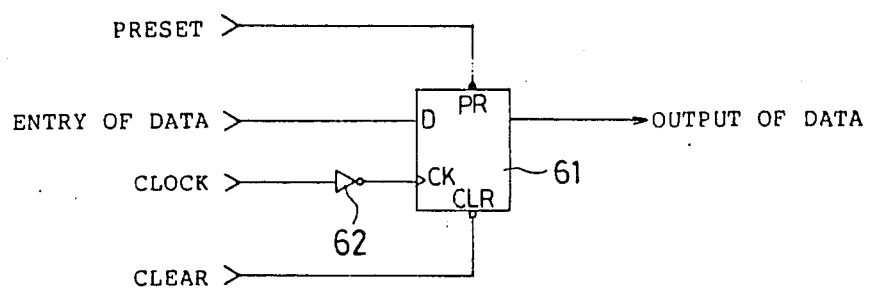
FIG. 8 is an electric circuit diagram showing another example of latch means.

In the embodiment above-mentioned, the JK flip-flops are used as latch means. As shown in FIG. 8, however, the similar results can be achieved by supplying the clock signal inverted by an inverter 62, to a clock input terminal of a D flip-flop 61.

The XOR gates (which are connected to the AND gates to be opened by the gate control signal 6) corresponding to addition means are not always connected to all JK flip-flops. However, it can be considered that the portions of the JK flip-flops to which the XOR gates are not connected, carry out addition exerting no influence upon the output signals of the JK flip-flops (for example, addition of zero). Therefore, XOR gates having one input terminal to which 0 is always supplied, can be connected to these portions of the JK flip-flops.

Figures 1, 6:
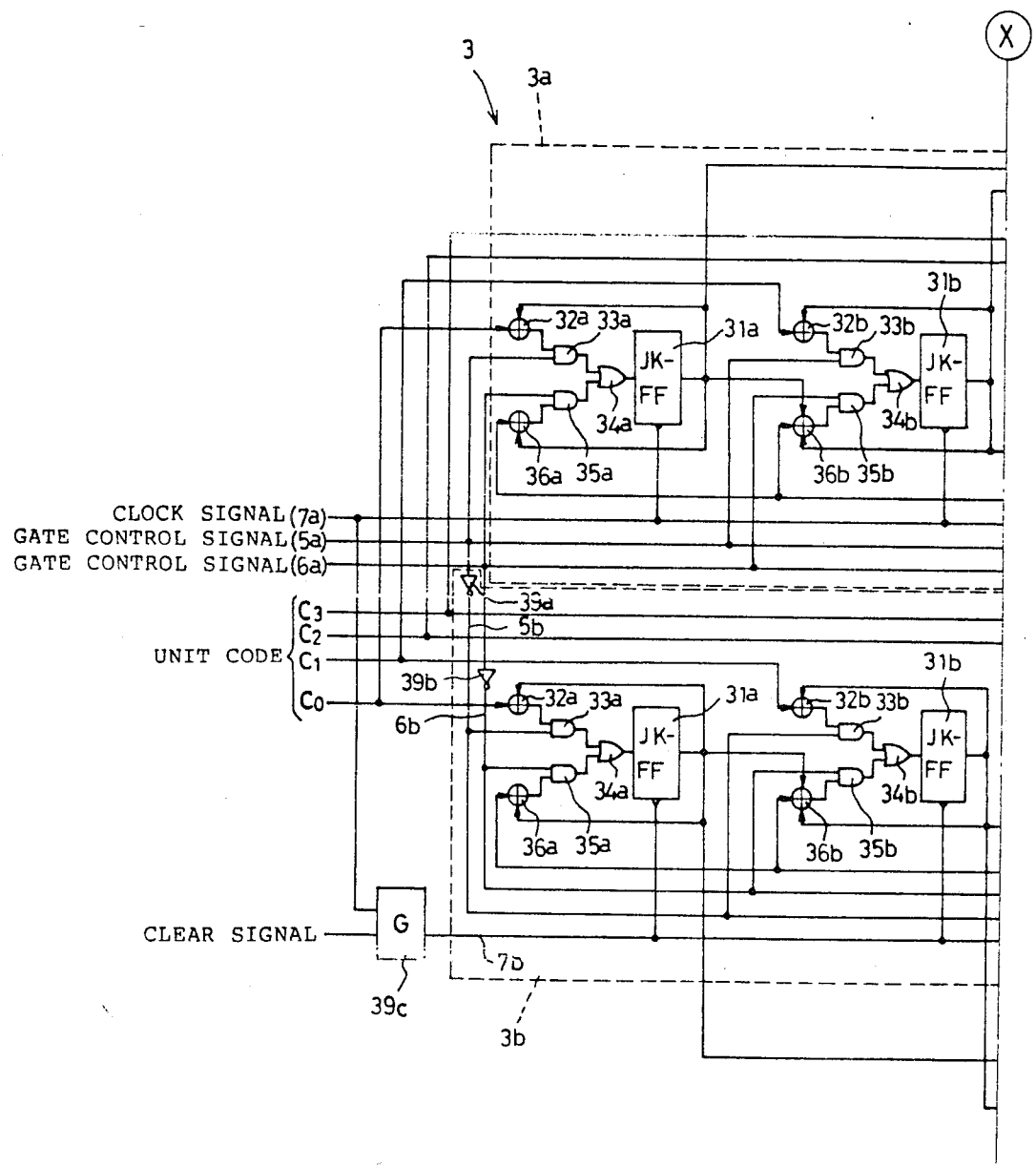
FIGS. 6(6-1 and 6-2) is an electric circuit diagram showing another embodiment of a syndrome calculating unit for calculating a syndrome $S_2$.
Figures 2, 6:
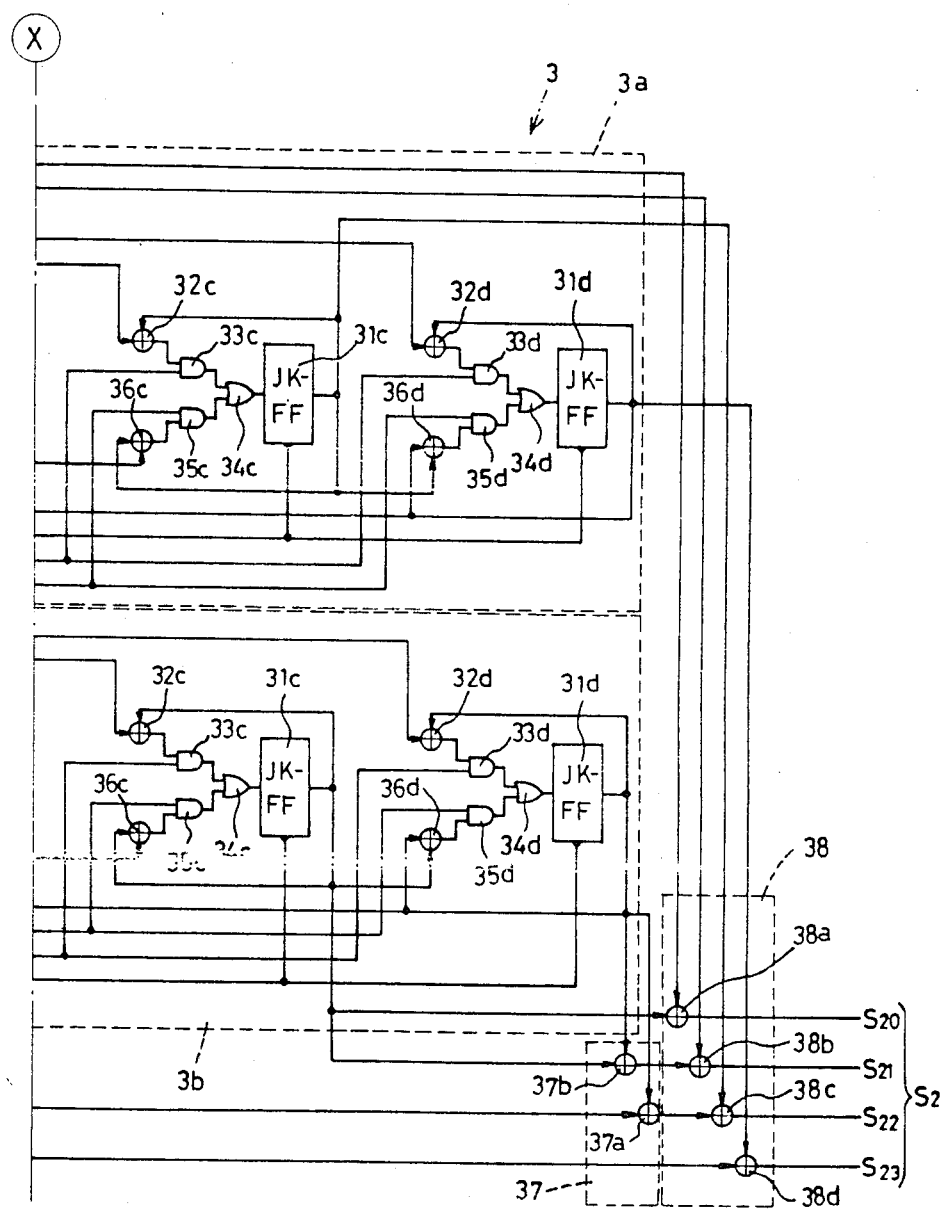

FIG. 6 is an electric circuit diagram showing another example of the syndrome calculating unit 3 which is mainly constituted by a calculating portion 3a for fetching unit codes in the odd place sequentially, and a calculating portion 3b for fetching unit codes in the even place sequentially, these calculating portions 3a and 3b being disposed for calculating the syndrome $S_2$.

In FIG. 6, like parts are designated by like numerals as in the embodiment in FIG. 2.

The calculating portion 3a has four JK flip-flops 31a, 31b, 31c and 31d corresponding to the respective bits of each of unit codes of a received code, and includes addition circuits 32a, 32b, 32c and 32d to which the respective bits of a unit code and the output signals of the JK flip-flops 31a, 31b, 31c and 31d are supplied, AND gates 33a, 33b, 33c and 33d adapted to be opened by a gate control signal 5a for supplying the output signals of the addition circuits 32a, 32b, 32c and 32d to OR gates 34a, 34b, 34c and 34d, respectively, and AND gates 35a, 35b, 35c and 35d adapted to be opened by a gate control signal 6a for supplying the output signals of the JK flip-flops 31a, 31b, 31c and 31d to corresponding OR gates 34a, 34b, 34c and 34d.

Addition circuits 36a, 36b, 36c and 36d comprising for example XOR gates are disposed at the input side of the AND gates 35a, 35b, 35c and 35d. The output signals of the JK flip-flops 31a and 31d are supplied to the input terminals of the addition circuit 36a, while the output signals of the JK flip-flops 31a, 31b and 31d are supplied to the input terminals of the addition circuit 36b. The output signals of the JK flip-flops 31b and 31c are supplied to the input terminals of the addition circuit 36c, while the output signals of the JK flip-flops 31c and 31d are supplied to the input terminals of the addition circuit 36d. A clock signal 7a is supplied to a clock input terminal of each of the JK flip-flops 31a, 31b, 31c and 31d. The description is omitted of the calculating portion 3b which has the same arrangement of that of the calculating portion 3a.

Further, the syndrome calculating unit 3 has a third addition unit 37 which includes an addition circuit 37a for adding the output signals of the JK flip-flops 31a and 31d of the calculating unit 3b to which unit codes in the even place are successively entered, and an addition circuit 37b for adding the output signals of the JK flip-flops 31c and 31d of the calculating unit 3b. This third addition unit 37 is adapted to supply the output signals of the JK flip-flops 31b and 31c as they are, thus producing the same result obtained by the multiplication of $\alpha^2$.

Further, the syndrome calculating unit 3 has a fourth addition unit 38 which includes addition circuits 38a, 38b, 38c and 38d. These addition circuits 38a, 38b, 38c and 38d respectively add each of the output signals of the JK flip-flops 31a, 31b, 31c and 31d of the calculating portion 3a to which unit codes in the odd place are successively entered, to the output signal of the JK flip-flop 31c of the calculating portion 3b, the output signal of the addition circuit 37b, the output signal of the addition circuit 37a and the output signal of the JK flip-flop 31b of the calculating portion 3b, respectively, thereby to obtain the syndrome $S_2$.

Inverters 39a and 39b are disposed for obtaining gate control signals 5b and 6b in inverted state of gate control signals 5a and 6a. A gate circuit 39c is adapted to be opened by a control signal and designed to generate a clock signal 7b of the calculating portion 3b, in addition to the clock signal 7a of the calculating portion 3a.

The following description will discuss the operation of the syndrome calculating unit arranged as above-mentioned.

Where $q_i = a_{2i}$ and $p_i = a_{2i+1}$, the syndrome $S_2$ can be expressed by the following equations:

$$\begin{aligned}
S_2 &= a_{14}(\alpha^2)^{14} + a_{13}(\alpha^2)^{13} + \ldots + a_1\alpha^2 + a_0 \\
&= \{a_{14}(\alpha^2)^{14} + a_{12}(\alpha^2)^{12} + \ldots a_2\alpha^2 + a_0\} + \\
&\quad \{a_{13}(\alpha^2)^{13} + a_{11}(\alpha^2)^{11} + \ldots a_1\alpha^2\} \\
&= \{q_7(\alpha^4)^7 + q_6(\alpha^4)^6 + \ldots + q_1\alpha^4 + q_0\} + \\
&\quad \{P_6(\alpha^4)^6 + p_5(\alpha^4)^5 \ldots + p_0\} \alpha^2 \\
&= T_7(\alpha^4) + \alpha^2 T_6(\alpha^4).
\end{aligned}$$

Since $q_i$ is also an element of the GF $(2^4)$, $q_i$ can be expressed by the following equation:

$$q_i = a_0 + a_1\alpha + a_2\alpha^2 + a_3\alpha^3$$

Therefore, $q_i\alpha^4$ can be expressed by the following equation:

$$q_i\alpha^4 = (c_0 + c_1\alpha + c_2\alpha^2 + c_3\alpha^3)\alpha^4$$
$$= (c_0 + c_3) + (c_0 + c_1 + c_3)\alpha + (c_1 + c_2)\alpha^2 + (c_2 + c_3)\alpha^3$$

The same can be applied to $p_i\alpha^4$

Accordingly, when the bits $c_0$, $c_1$, $c_2$ and $c_3$ are respectively applied to the addition circuits 32a, 32b, 32c and 32d and the AND gates 33a, 33b, 33c and 33d are opened by the gate control signal 5a, the JK flip-flops 31a, 31b, 31c and 31d supply the bits $c_0$, $c_1$, $c_2$ and $c_3$ as they are. Therefore, when the AND gates 35a, 35b, 35c and 35d are opened by the gate control signal 6a, the bits $c_0$ and $c_3$ as added to each other by the addition circuit 36a, are supplied to the JK flip-flop 31a, the bits $c_0$, $c_1$ and $c_3$ as added to one another by the addition circuit 36b are supplied to the JK flip-flop 31b, the bits $c_1$ and $c_2$ as added to each other by the addition circuit 36c are supplied to the JK flip-flop 31c and the bits $C_2$ and $c_3$ as added to each other by the addition circuit 36d are supplied to the JK flip-flop 31d. That is, without multiplication specially carried out, the JK flip-flops 31a, 31b, 31c and 31d supply a series of bits corresponding to $(c_0+c_3)+(c_0+c_1+c_3)\alpha+(c_1+c_2)\alpha^2+(c_2+c_3)\alpha^3$.

By repeating the operations above-mentioned, $T_7(\alpha^4)$ can be obtained in the calculating portion 3a, while $T_6(\alpha^4)$ can be obtained in the calculating portion 3b.

Thereafter, by supplying the output bits of the calculating portion 3b to the third addition circuit 37, the output signals of the JK flip-flops 31c and 31d are added to each other, the output signals of the JK flip-flops 31a and 31d are added to each other and the output signals of the JK flip-flops 31b and 31c are supplied as they are.

That is, there can be supplied the same output signals as those obtained when the following calculation is carried out;

$$a_i\alpha^2 = (c_0 + c_1\alpha + c_2\alpha^2 + c_3\alpha^3)\alpha^2$$
$$= c_2 + (c_2 + c_3)\alpha + (c_0 + c_3)\alpha^2 + c_1\alpha^3.$$

Finally, the output signals of the calculating portion 3a and the output signals of the third addition circuit 37 are supplied to the fourth addition circuit 38, so that $T_7(\alpha^4)+\alpha^2T_6(\alpha^4)=S_2$ or the syndrome $S_2$ can be obtained.

The following description will discuss in more detail the foregoing with reference to FIG. 7 showing a timing chart.

The clock signals 7a and 7b (See A and B in FIG. 7) having the same phase and the same period are supplied to the JK flip-flops 31a, 31b, 31c and 31d of each of the calculating portions 3a and 3b, the gate control signals 5a and 5b (See C and E in FIG. 7) opposite in phase and having the same period are supplied to the AND gates 33a, 33b, 33c and 33d, and the gate control signals 6a and 6b (See D and F in FIG. 7) opposite in phase and having the same period are supplied to the AND gates 35a, 35b, 35c and 35d. The gate control signals 5a and 6a above-mentioned are opposite in phase and have the same period, and the gate control signals 5b and 6b above-mentioned are opposite in phase and have the same period. The gate control signals above-mentioned have a period twice that of the clock signal.

Accordingly, at the beginning of syndrome calculation, the gate control signal 5a is in the high level to open the AND gates 33a, 33b, 33c and 33d of the calculating portion 3a, so that the first unit code $a_{14}$ (See G in FIG. 7) is fetched by the JK flip-flops 31a, 31b, 31c and 31d.

Then, the gate control signal 5a becomes the low level to close the AND gates 33a, 33b, 33c and 33d of the calculating portion 3a. As the result, fetching of a unit code is stopped, and the gate control signals 5b and 6a become the high level. When the gate control signal 5b becomes the high level, the AND gates 33a, 33b, 33c and 33d of the calculating portion 3b are opened so that the second unit code $a_{\_}$ is fetched by the JK flip-flops 31a, 31b, 31c and 31d. When the gate control signal 6a becomes the high level, the AND gates 35a, 35b, 35c and 35d of the calculating portion 3a are opened. The output signals of the JK flip-flops 31a, 31b, 31c and 31d are then supplied respectively to the corresponding addition circuits 36a, 36b, 36c and 36d, in which necessary addition operations are carried out. The results thus added are again fetched by the JK flip-flops 31a, 31b, 31c and 31d.

Thereafter, the gate control signal 5b becomes the low level to close the AND gates 33a, 33b, 33c and 33d of the calculating portion 3b. As the result, fetching of a unit code is stopped, and the gate control signals 5a and 6b become the high level. When the gate control signal 5a is in the high level, the AND gates 33a, 33b, 33c and 33d of the calculating portion 3a are opened so that the third unit code $a_{12}$ is fetched by the JK flip-flops 31a, 31b, 31c and 31d. When the gate control signal 6b is in the high level, the AND gates 35a, 35b, 35c and 35d of the calculating portion 3b are opened. The output signals of the JK flip-flops 31a, 31b, 31c and 31d are then supplied respectively to the corresponding addition circuits 36a, 36b, 36c and 36d, in which necessary addition operations are carried out. The results thus added are again fetched by the JK flip-flops 31a, 31b, 31c and 31d.

Thereafter, by repeating the operations above-mentioned, unit codes in the even place and unit codes in the odd place are respectively fetched by the calculating portions 3a and 3b. The unit codes thus fetched are subjected to addition corresponding to the multiplication of power of the root. The timing of the unit code fetching and addition in the calculating portion 3a is reverse to that in the calculating portion 3b. As a whole, therefore, the fetching and addition operation is not interrupted at all, thus assuring high-speed processing.

The detailed description above-mentioned has been made of another example of the syndrome calculating unit 3 for calculating the syndrome $S_2$. For other syndromes $S_1$ and $S_3$, a syndrome calculating unit similar to said another example can be used, which will be schematically discussed in the following.

For the syndrome $S_1$, the following equation is established:

$$S_1 = a_{14}\alpha^{14} + a_{13}\alpha^{13} + \ldots + a_1\alpha + a_0$$
$$= (a_{14}\alpha^{14} + a_{12}\alpha^{12} + \ldots + a_2\alpha^2 + a_0) +$$
$$(a_{13}\alpha^{13} + a_{11}\alpha^{11} + \ldots + a_1\alpha)$$
$$= \{q_7(\alpha^2)^7 + q_6(\alpha^2)^6 + \ldots + q_1\alpha^2 + q_0\} +$$
$$\{p_6(\alpha^2)^6 + p_5(\alpha^2)^5 + \ldots + p_0\}\alpha$$
$$= T_7(\alpha^2) + \alpha\, T_6(\alpha^2).$$

For the syndrome $S_3$, the following equation is established:

$$S_3 = a_{14}(\alpha^3)^{14} + a_{13}(\alpha^3)^{13} + \ldots + a_1\alpha^3 + a_0$$
$$= \{a_{14}(\alpha^3)^{14} + a_{12}(\alpha^3)^{12} + \ldots + a_2(\alpha^3)^2 + a_0\} +$$
$$\{a_{13}(\alpha^3)^{13} + a_{11}(\alpha^3)^{11} + \ldots + a_1\alpha^3\}$$
$$= \{q_7(\alpha^6)^7 + q_6(\alpha^6)^6 + \ldots + q_1\alpha^6 + q_0\} +$$
$$\{p_6(\alpha^6)^6 + p_5(\alpha^6)^5 + \ldots + p_0\}\,\alpha^3$$
$$= T_7(\alpha^6) + \alpha^3 T_6(\alpha^6).$$

Accordingly, for the syndrome $S_1$, it is enough to dispose a calculating portion for calculating $T_7(\alpha^2)$, a calculating portion for calculating $T_6(\alpha^2)$, an addition circuit which produces the same result obtained by the multiplication of the calculation result of $T_6(\alpha^2)$ by $\alpha$ and another addition circuit for adding the output signal of the first-mentioned addition circuit to the calculation result of $T_7(\alpha^2)$.

For the syndrome $S_3$, it is enough to dispose a calculating portion for calculating $T_7(\alpha^6)$, a calculating portion for calculating $T_6(\alpha^6)$, an addition circuit which produces the same result obtained by the multiplication of the calculation result of $T_6(\alpha^6)$ by $\alpha^3$ and another addition circuit for adding the output signal of the first-mentioned addition circuit to the calculation result of $T_7(\alpha^6)$.

After a series of calculating operations required have been carried out, a clear signal is supplied to the JK flip-flops 31a, 31b, 31c and 31d to clear the content to zero, thus preparing for the next syndrome calculation.

For a circuit for generating the gate control signals 5a and 6a and the clock signal 7a, there can be used the circuit shown in FIG. 4 as it is. That is, the gate control signals 5 and 6 in the circuit in FIG. 4, are used, as they are, as the gate control signals 5a and 6a, while the clock signal 7 as it is used as the clock signal 7a.

As apparent from the foregoing, with a simple arrangement of feedback units and addition units only, this embodiment can eliminate time of waiting for unit code fetching and time of waiting for addition operation, thereby to achieve the syndrome calculation at a high speed.

In the embodiment above-mentioned, the JK flip-flops are used as latch means. As shown in FIG. 8, however, the same results can be achieved by supplying a clock signal inverted by the inverter 62 to the clock input terminal of the D flip-flop 61.

It is noted that the present invention should not be limited to these embodiments above-mentioned. For example, for the application where the code length is long and there are many error correcting symbols, this invention can be used by changing the combination of the gates. In addition, the following equation can be used as the generator polynomial g (x):

$$g(x) = (x-\alpha)(x-\alpha^2)\ldots(x-\alpha^{2t}).$$

Various modifications in designing can be made without departing from the spirit of the invention.

What is claimed is:

1. Syndrome calculating apparatus to which received codes are successively supplied to obtain syndromes, comprising:
   first addition means for respectively supplying the bits of each of unit codes constituting a received code, to a plurality of latch means;
   second addition means for supplying, to at least one of said plurality of latch means, the output bit of at least one of said plurality of latch means;
   gate means for supplying the signals of said first and second addition means to said plurality of latch means, respectively; and
   gate control means for selectively opening said gate means;
   the output bits of said plurality of latch means being supplied to said first addition means connected to said plurality of latch means;
   the output bit of said at least one of said plurality of latch means being supplied to said second addition means connected to said at least one of said plurality of latch means so as to produce the same result as that obtained by the operation of multiplication of power of the root of the primitive polynomial in the Galois field.

2. Syndrome calculating apparatus as set forth in claim 1, wherein the Galois field is GF ($2^m$).

3. Syndrome calculating apparatus to which received codes are successively supplied to obtain syndromes, comprising:
   a pair of calculating units to which unit codes in the odd place and unit codes in the even place are respectively entered successively;
   third addition means for adding the output bits of one of the pair of calculating units to which unit codes in the even place are successively entered, to one another so that such addition corresponds to the operation of multiplication of power of the root; and
   fourth addition means for adding the output bits of the other of said pair of calculating units to which unit codes in the odd place are successively entered, to the output bits of said third addition means in a correlative manner; and
each calculating unit further comprises:
   first addition means for respectively supplying the bits of each of unit codes constituting a received code to a plurality of latch means;
   second addition means for supplying, to at least one of said plurality of latch means, the output bit of at least one of said plurality of latch means;
   gate means for supplying the signals of the first and second addition means to said plurality of latch means, respectively;
   gate control means for selectively opening said gate means;
   the output bits of said plurality of latch means being supplied to the first addition means connected to said plurality of latch means;
   the output bit of said at least one of said plurality of latch means being supplied to the second addition means connected to said at least one of said plurality of latch means so as to produce the same result as that obtained by the operation of multiplication of power of the root of the primitive polynomial in the Galois field.

4. Syndrome calculating apparatus as set forth in claim 3, wherein the Galois field is GF $(2^m)$.

* * * * *

UNITED STATES PATENT AND TRADEMARK OFFICE
CERTIFICATE OF CORRECTION

PATENT NO. : 4,763,330

DATED : August 9, 1988

INVENTOR(S) : Hiroshi Shimizu

It is certified that error appears in the above-identified patent and that said Letters Patent is hereby corrected as shown below:

On the Title Page of the patent there should be inserted,

--Foreign Application Priority Data

May 6, 1986 [JP] Japan .................. 61-103684
May 6, 1986 [JP] Japan .................. 61-103685--

Signed and Sealed this

Fourteenth Day of March, 1989

Attest:

DONALD J. QUIGG

*Attesting Officer*      *Commissioner of Patents and Trademarks*